United States Patent
Chen et al.

(10) Patent No.: US 6,344,408 B1
(45) Date of Patent: Feb. 5, 2002

(54) METHOD FOR IMPROVING NON-UNIFORMITY OF CHEMICAL MECHANICAL POLISHING BY OVER COATING

(75) Inventors: Hsueh-Chung Chen, Taipei Hsian; Ming-Sheng Yang; Juan-Yuan Wu, both of Hsin-Chu; Water Lur, Taipei, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/296,177

(22) Filed: Apr. 22, 1999

(51) Int. Cl.⁷ .......................................... H01L 21/4763
(52) U.S. Cl. ...................................................... 438/633
(58) Field of Search ................................ 438/633, 637, 438/641, 643, 645, 648, 675, 687

(56) References Cited

U.S. PATENT DOCUMENTS 5,618,381 A * 4/1997 Doan et al. ................. 438/633

* cited by examiner

Primary Examiner—David Nelms
Assistant Examiner—Quoc Hoang

(57) ABSTRACT

A method for improving non-uniformity of chemical mechanical polishing by over coating layer is disclosed. The essential point of the invention is that an over coating layer is formed over a surface before the surface is planarized by a chemical mechanical polishing process. Note that polishing rate of the over coating layer must be less than the polishing rate of the surface, where the ratio of polishing rate is called as selectivity. Because the topography of the surface is not uniform, the topography of the over coating layer also is non-uniform and then the polishing probability in different parts of the over coating layer is different. Obviously, when the over coating layer on the higher area part of the surface is totally consumed, these are residual over coating layer on the lower area part of the surface. Thus, over polishing in the lower area part is prevented by residual over coating layer. Before total over coating layer is polished, the polished account of the surface is higher in the high area part and is lower in the lower area part. Thus, uniformity of the surface is enhanced. Moreover, enhancement of uniformity is direct proportional to product of selectivity and depth of over coating layer.

20 Claims, 5 Drawing Sheets

METHOD FOR IMPROVING NON-UNIFORMITY OF CHEMICAL MECHANICAL POLISHING BY OVER COATING

BACKGROUND OF THE INVENTION

1. Field of the Invention

The present invention relates to a method for improving non-uniformity of chemical mechanical polishing and more particularly to a method that an over coating layer is formed on a surface before the surface is polished. Because polishing rate of the over coating layer is less than the underlying surface, the uniformity of polished surface is enhanced.

2. Description of the Prior Art

Chemical mechanical polishing (CMP) is a standard method in deep submicron fabrication. Although the fabrication of CMP is more complicated than other conventional planarization method such as spin on glass (SOG), but the global planarization of surface that planarized by CMP is excellent than other conventional planarization method. Thus, CMP is widespread used in deep submicron fabrication.

The chemical mechanical polishing is employed to enhance uniformity of a surface, where a plurality of semiconductor structures are located in and on the surface and a coating layer is employed to cover the surface and these semiconductor structures. In addition, possible semiconductor structures comprise gate, electrode of capacitor, isolation layer and metal plug. A typical example of CMP is shown in FIG. 1A and FIG. 1B, where prior metal line 10 is formed over a wafer then metal structure 12 is formed on prior metal line 10, and a plurality of trenches 14 are inside metal structure 12. Afterwards, barrier layer 18 and coating layer 16 are formed over metal structure 12 in sequence, where application of barrier layer 18 comprises insulation and enhances adhesion. Obviously, as shown in FIG. 1A, because the topography of metal structure 12 is not uniform, the topography of coating layer 16 also is non-uniform. Because the uniformity of CMP is restricted by uniformity of unpolished surface and what structures is underlying the unpolished surface, the polished surface of coating layer 16 still is not prefect uniform and there are dishings above trenches 14, as shown in FIG. 1B. Thus, though the global planarization of CMP is excellent than other conventional planarization method, but it is uniformity of CMP still is improvable.

Expect the intrinsic restriction as describe in former discussion, the uniformity of CMP also be decreased by an extrinsic restriction. Because in many recent applications of CMP, details of CMP process are under-researched and not well known, then the fabrication of CMP application is not optimized. In addition, both numbers of main parameters of the CMP application and mechanism of each main parameter is dependent on what material is polished. For example, main parameters are material of pad and rotating rate of pad for $SiO_2$ wafer, but main parameters is pH value of slurry for tungsten-CMP. Thus, if details of CMP process are not well known then the efficiency of CMP is decreased and uniformity of polished surface is degraded.

According to the previous discussion, uniformity of polished surface is degraded if CMP process is not optimized. Moreover, it is more serious when details of related CMP application are still under-researched and it is impossible to optimize CMP process. For example, Cu-CMP is employed by Cu damascene process to remove residual Cu and form required Cu structure. Nevertheless, both slurry and pad of Cu-CMP are under-researched, so Cu-CMP process is not optimized and then there are dishing and erosions on formed Cu structures, where a typical depth of the dishing is about 1500 angstroms.

For the foregoing reasons, it is important in CMP application that enhances uniformity of polished surface that covers non-uniform structures. Furthermore, it is an urgent problem in many recent CMP applications that how to overcome the non-uniformity which induced by lacking of knowledge about details of CMP process.

SUMMARY OF THE INVENTION

In accordance with the present discussion, a method is provided to improve non-uniformity of CMP. By the method, an over coating layer is formed over a surface before the surface is planarized by CMP, and in following CMP process the polishing rate of the over coating layer is less than polishing rate of the surface, where the ratio of polishing rate is called as selectivity. Because both the topography of the surface and the topography of the over coating layer are uniform, polishing probability is different in different parts of both the over coating layer and the surface. Thus, when the over coating layer on the higher area part of the surface is totally consumed, these are residual over coating layer on the lower area part of the surface. Then over polishing in the lower area part is prevented by residual over coating layer. Before total over coating layer is polished, the polished account of the surface is higher in the high area part and is lower in the lower area part. Thus, uniformity of the surface is enhanced. Moreover, enhancement of uniformity is direct proportional to product of the selectivity and the depth of the over coating layer.

In the first embodiment, the invention is employed to enhance uniformity of surface that planarized by chemical mechanical polishing by an over coating layer. In the embodiment, CMP process is employed to improve uniformity of a surface of a semiconductor wafer, where a plurality of semiconductor structures is formed in and on the surface and a coating layer is formed over the semiconductor wafer and employed to cover these semiconductor structures. Before the surface is polished, an over coating layer is formed over the coating layer where polishing rate of the over coating layer must be less than polishing rate of the coating layer. Afterwards, a chemical mechanical polishing process is employed to planarize the surface of the semiconductor wafer.

In another embodiment of the invention, the invention is employed to enhance uniformity of metal layer that produced by metal damascene process. Provided embodiment comprises following steps: First, a metal structure is formed on a surface of a wafer, where the surface comprises a prior metal lines and a plurality of trenches are formed in the metal structure. Then a metal barrier layer is formed over the surface of the metal structure. Afterwards, a metal layer is formed over the metal barrier layer and fills these trenches. Second, an over coating layer is formed on the metal layer, where the polishing rate of the over coating layer must be less than the polishing rate of the metal layer. Third, a chemical mechanical polishing process is employed to planarize the surface of the wafer until total the over coating layer is removed. By the way, part of the metal layer is removed and non-uniformity of the surface is improved.

In the last embodiment, the invention is employed to enhance uniformity of copper chemical mechanical polishing by an over coat layer. First, a semiconductor structure is formed on a surface of a wafer where a trench is located in the semiconductor structure. Second, a copper barrier layer is formed on surface of the semiconductor structure by chemical vapor deposition. Third, a copper layer is formed over the copper barrier and fills the trench. Afterwards, an over coating layer is formed on the copper layer, where polishing rate of the over coating layer is less than the copper layer. Finally, a chemical mechanical polishing process is employed to planarize surface of the copper layer. Because the polishing probability is different in different part of the surface, it is higher in high area part and is low in lower area part, the uniformity of the polished surface is enhanced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
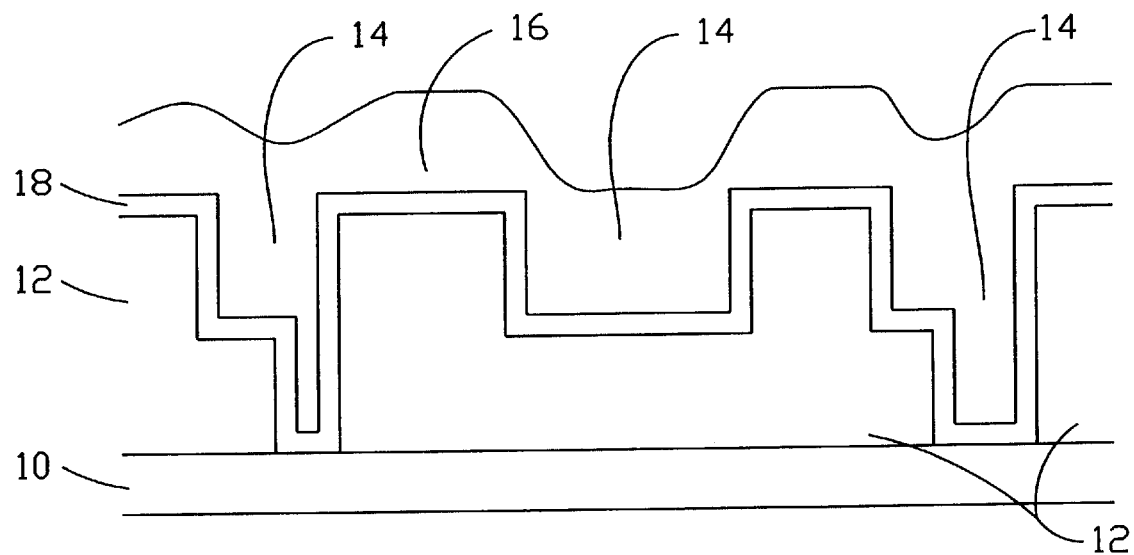
FIGS. 1A and 1B show cross sectional views illustrative of conventional chemical mechanical polishing process.
Figure 1B:
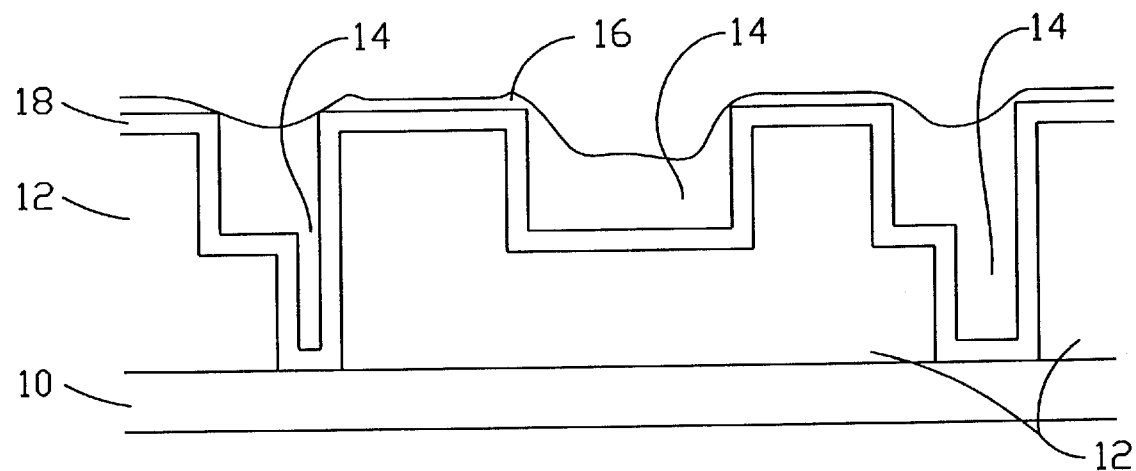
Figure 2A:
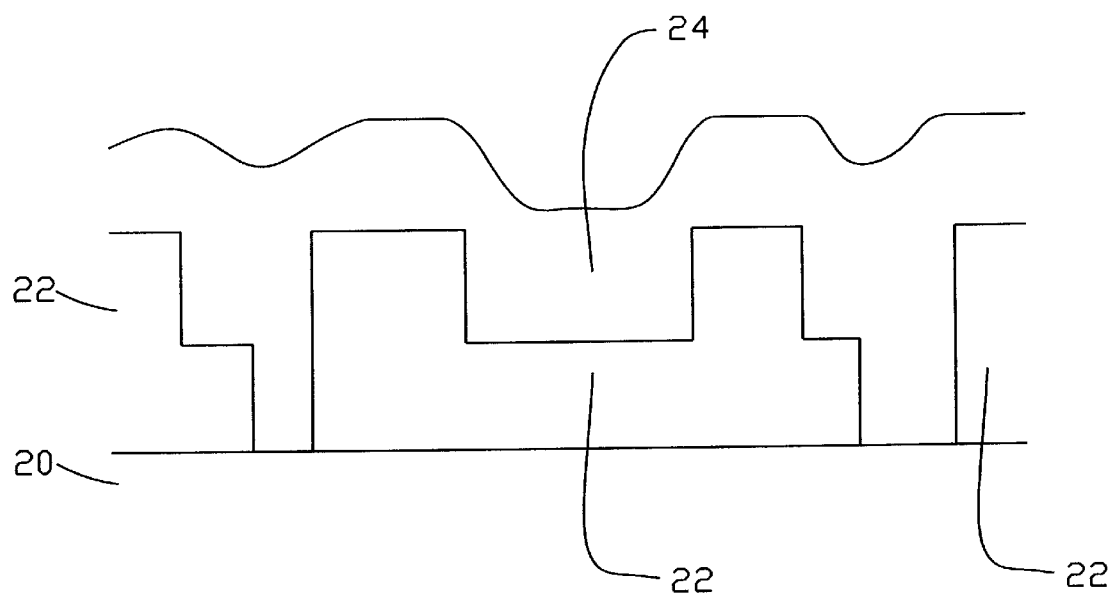
FIG. 2A to FIG. 2D show cross-sectional views illustrative of four stages in the process of chemical mechanical polishing with one embodiment of the present invention.

In the first embodiment, the invention is employed to improve the non-uniformity of chemical mechanical polishing by an over coating layer. As shown in FIG. 2A, a plurality of semiconductor structures 22 are formed in and on a surface of semiconductor wafer 20, where possible semiconductor structures 22 comprise gate, electrode of capacitor, isolation layer, metal plug, and metal structure. No matter how, the invention is independent on detail of semiconductor structures 22. Thereafter, coating layer 24 is formed over the surface of semiconductor wafer 20 and covers semiconductor structures 22, where material of coating layer 24 is dependent on details of semiconductor structures 22 and comprises metal and dielectric. For example, if semiconductor structures 22 are employed to define location of metal line in metal damanscene process then coating layer 24 is a metal layer. Obviously, because the topography of semiconductor structures 22 is not uniform, the topography of coating layer 24 also is not uniform. Note that the non-uniformity of the topography of coating layer 24 is direct proportional to the non-uniformity of the topography of semiconductor structures 22.

Figure 2B:
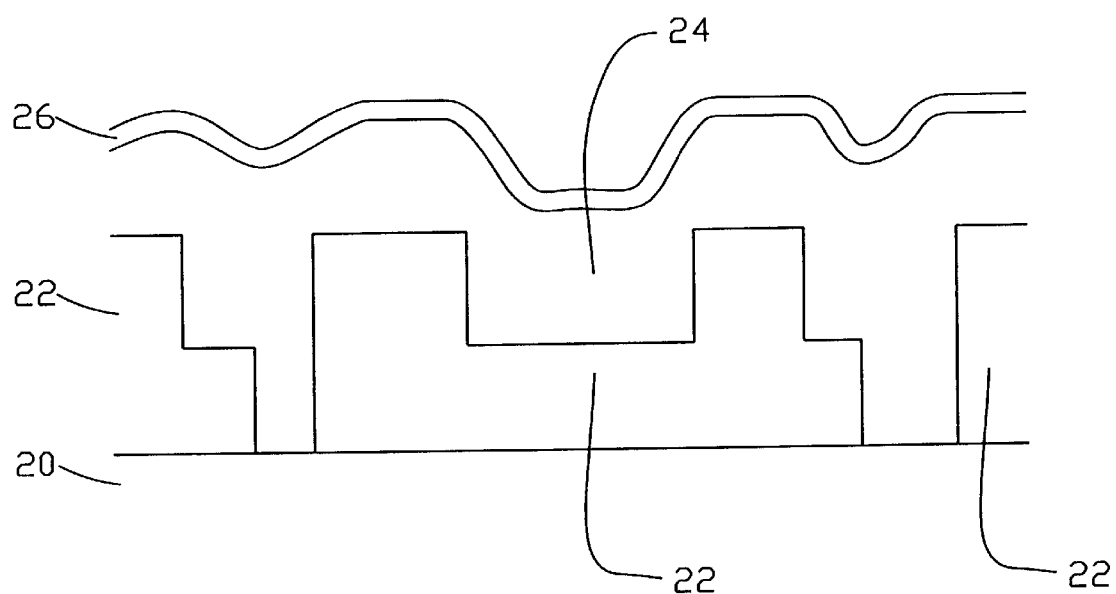

Substitute direct planarize coating layer 24 to archive global planarization by the CMP, in the embodiment an over coating layer 26 is formed over the surface of semiconductor wafer 20 as shown in FIG. 2B. Moreover, not only depth of over coating layer 26 is direct proportional to non-uniformity of coating layer 24, but also material of over coating layer is selected to let polishing rate of over coating layer 26 must be less than polishing rate of coating layer 24 in following CMP process. In addition, the ratio of polishing rate is called as selectivity. Possible material of over coating layer 26 comprises metal barrier layer material and metal, and if material of metal barrier is employed then fabrication is simplified. In addition, method of forming over coating layer 26 comprises chemical vapor deposition method and physical vapor deposition method.

Afterwards, a chemical mechanical polishing process is employed to planarize the surface, where both slurry of coating layer 24 and slurry of over coating layer 26 are used for both layers are polished. Because the CMP comprises both chemical reaction and mechanical reaction, the polishing probability in different point of the polished surface is restricted by the topography. Obviously, the polishing probability is larger in the higher area part of the over coating layer 26 and is smaller in the lower area part of the over coating layer 26. Thus, the removed account is larger in the higher area part but is smaller in the lower area part.

Figure 2C:
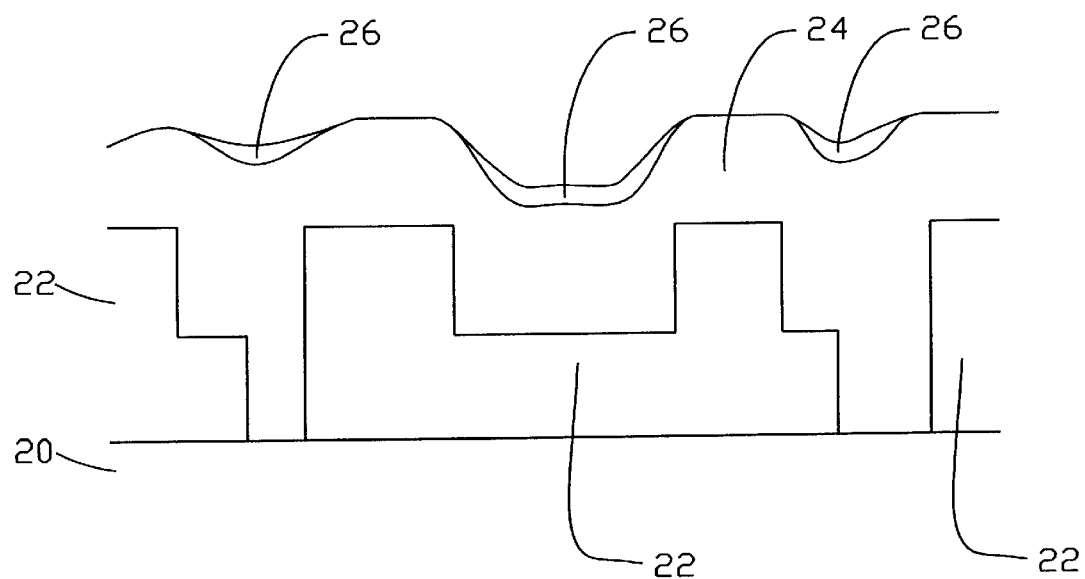

Afterwards, as shown in FIG. 2C, when the higher area part of over coating layer 26 is totally removed, there is still some lower area part of over coating layer 26 is residual. Where the residual account of over coating layer 26 is direct proportion to the depth of over coating layer 26. Thereafter, the higher area part of coating layer 24 and residual lower area part of over coating layer 26 are polished at the same time. Because the polishing rate of coating layer 24 is larger than over coating layer 26, the removed account in the higher area part of the surface is larger than the removed account in the lower area part of the surface. Thus, the higher area part of the surface is removed until the residual over coating layer 26 is totally consumed. Obviously, the removed account of coating layer 24 is direct proportional to the account of the residual over coating layer 26.

Figure 2D:
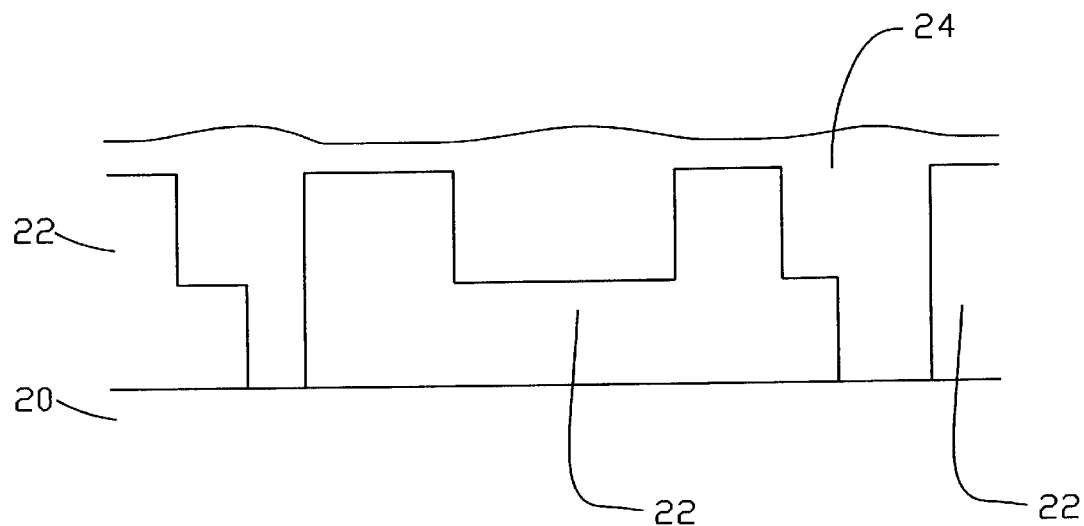

By previous planarizing process, as shown in FIG. 2D, the non-uniformity of surface of semiconductor wafer 20 is improved and the degree of improvement is direct proportion to the product of selectivity and depth of over coating layer 26. In other words, the removed account of higher area part of coating layer 24 is direct proportion to the product of selectivity and depth of over coating layer 26, and then the topography of polished surface is controlled by adjust the depth and the material of over coating layer 26.

Moreover, the material and the depth of over coating layer 26 also are main factors of the method. First, the only restriction of material is that the polishing rate of over coating layer 26 must be less than the polishing rate of coating layer 24, and the selectivity is more sensitive more good. Thus, the available choice of material is widespread and any material with well-known CMP process can be employed. Thus, any non-uniformity that induced by lacking knowledge of details of CMP process can be improved by forming over coating layer with a well-known material. Second, because the account of residual over coating layer 26 is direct proportional to the depth of over coating layer 26 and it also is direct proportional to non-uniformity of coating layer 24. Thus, by modulating distribution of over coating layer 26, it is possible to totally consume the higher area part of coating layer 24 and the lower area part of over coating layer 26 at the same time. Although the ordinary method of forming over coating layer 26 is deposition method, but other methods can be employed to form over coating layer 26 with non-conformal depth, for example the molecular beam epitaxy (MBE). In other words, the forming method of over coating layer 26 is modulated to change the distribution and depth of over coating layer 26. By the way, the residual account of over coating layer 26 is adjusted and uniformity of the polished surface is enhanced. Obviously, the depth of over coating layer 26 is direct proportional to non-uniformity of coating layer 24, and a typical depth of over coating layer 26 is about 100 angstroms to 1500 angstroms.

Figure 3A:
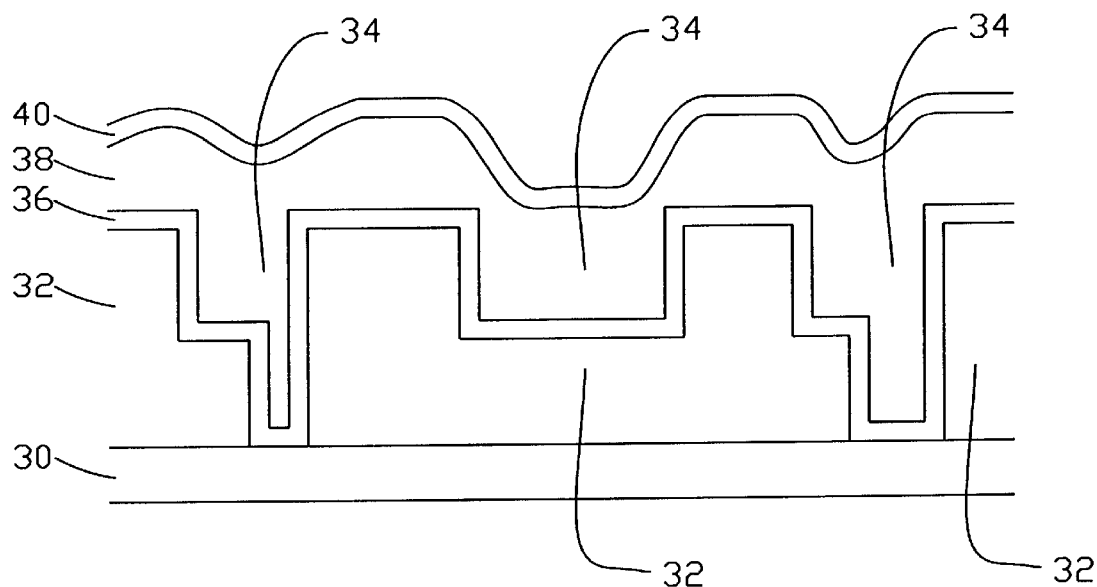
FIG. 3A to FIG. 3C show cross-sectional views illustrative of various stages of chemical mechanical polishing with another embodiment of the present invention.

In the second embodiment of the invention, a method for improving non-uniformity of metal damascene by over coating layer is disclosed. The method comprises following steps: First as shown in FIG. 3A, a metal structure 32 is formed on a surface of a wafer 30, wherein a plurality of trenches 34 locate in metal structure 32. In addition, the surface of wafer 30 comprises a prior metal line or other semiconductor structures such as gate and interconnect. Obviously, because there are a plurality of trenches 34 inside metal structure 32 then the topography of metal structure 32 is non-uniform.

Second, a metal barrier layer 36 is formed on the surface of metal structure 32 and then a metal layer 38 is formed over metal barrier layer 36 to form coating layer and fill trenches 34. However, the surface of coating layer 38 is not uniform and non-uniformity of the surface is direct proportion to the non-uniformity of metal structure 32.

Thereafter, over coating layer 40 is formed over metal layer 38 and the depth of over coating layer 40 is direct proportional to the non-uniformity of metal layer 38. In addition, the polishing rate of over coating layer 40 must be less than the polishing rate of metal layer 38, where the ratio of polishing rate is called as selectivity. In addition, method of forming over coating layer 40 comprises chemical vapor deposition method and physical vapor deposition method, and the material of over coating layer 40 comprises material of metal barrier layer 36 such as Ta, TaN, Ti and TiN. For examples, if metal layer 38 is a copper layer then over coating layer 40 is a Ta layer or a TaN layer, and if metal layer 38 is an aluminum layer then over coating layer 40 is a Ti layer or a TiN layer. No matter how, because the mechanism of the embodiments is similar to the previous embodiment, these restrictions of material and depth of over coating layer 40 are equivalent to the previous embodiment.

Figure 3B:
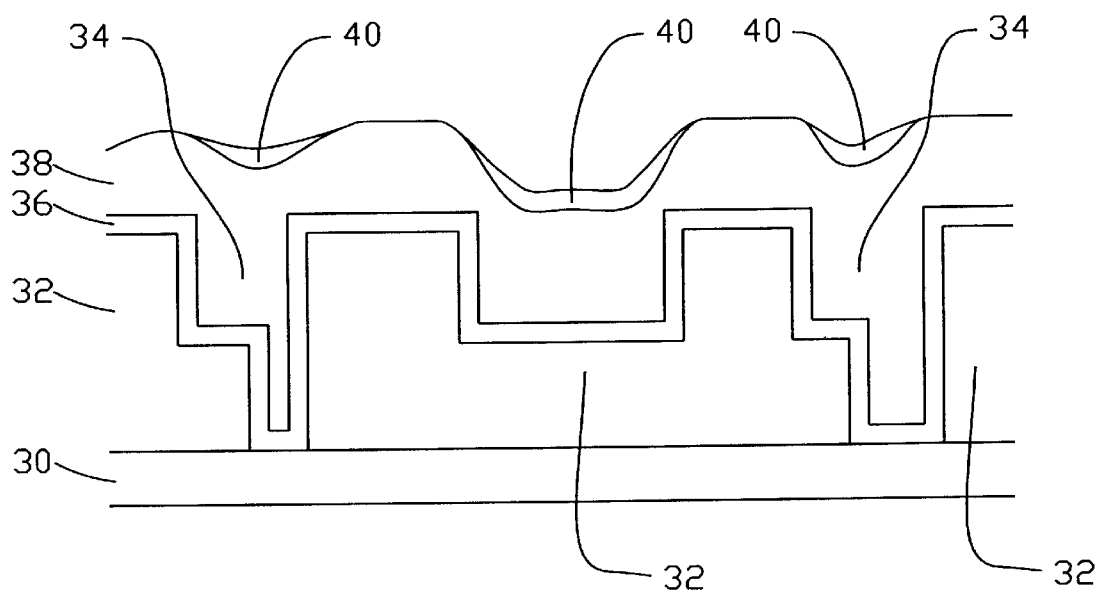

Third, as shown on FIG. 3B, a chemical mechanical polishing process is employed to planarize the surface of wafer 30, and remove part of over coating layer 40 that does not locate inside said trenches 34. Furthermore, because different materials have different polishing rate and different part of polished surface have different polishing probability, the removed account is larger in the higher area part and is smaller in the lower area part. Thus, when the higher area part of over coating layer 40 is totally consumed, some lower area part of metal layer 38 still is covered by residual over coating layer 40. In other words, most over coating layer 40 and part of metal layer 38 are removed and then uniformity of the surface is enhanced.

Figure 3C:
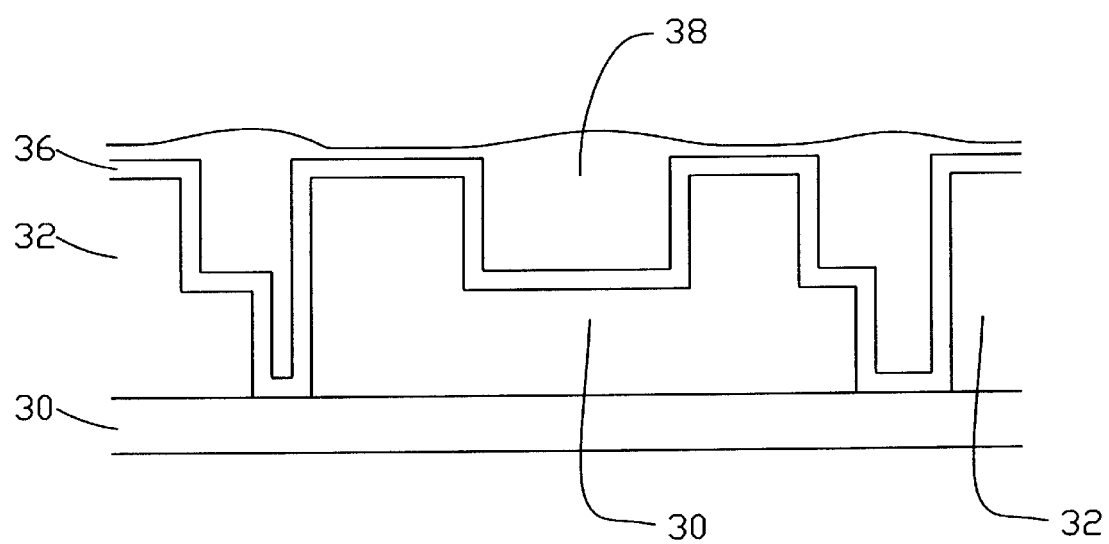

Finally, the surface of wafer 30 is steadily polished by CMP process but the polishing rate is different in different part of the surface. The higher area part of surface of wafer 30 is metal layer 38, but the lower area part of surface of wafer 30 is the residual over coating layer 40 and polishing rate of over coating layer 40 is higher than polishing rate of metal layer 38. Thus, the removed account of the higher area part is larger than the lower area part. Then the higher area part of metal layer 38 is consumed and the uniformity of the surface of wafer 30 is enhanced, as shown in FIG. 3C. Of course, the removed account of high area part of metal layer 38 is direct proportion to the product of selectivity and depth of over coating layer 40. Consequently, the uniformity of CMP is effectively enhanced by different polishing rate in different part of the surface.

Obviously, main variables of the method are material and depth of over coating layer 40, as in the previous embodiment. First, the only requirement about material of over coating layer 40 is that polishing rate must be less than polishing rate of coating layer 38 and the selectivity is more sensitive more good. Thus, the available material of over coating layer 40 is extensive and many material with well-known are available. Thus, the uniformity of metal layer 38 is not restricted by the material of metal layer 38 and correlative details of CMP process. Second, it is possible to form a completely uniform surface of metal layer 38 by modulating forming process of over coating layer 40 to change depth and shape of residual over coating layer 40. Third, though the ordinary forming method of over coating layer 40 is deposition method, but other methods can be employed to form over coating layer 40 with non-conformal depth. In other words, the uniformity of the polished surface is enhanced by modulating the depth and the distribution of the residual account of over coating layer 40. Obviously, the depth of over coating layer 40 is direct proportional to the non-uniformity of coating layer 38, and a typical depth is about 100 angstroms to 1500 angstroms.

In addition, as in first embodiment, slurry of the embodiment comprises slurry of metal layer 38 and slurry of over coating layer 40. The advantage of employing both slurries is that using different slurry in different polishing process can enhance the efficiency of the CMP process. No matter how, if the slurry is not the important factor during the CMP process, it is beneficial that metal layer 38 and over coating layer 40 are polished with the same slurry, and then related fabrication is simplified for only a slurry is necessary.

In the last embodiment, the invention is employed to enhance uniformity of copper chemical mechanical polishing by over coating layer. The most details of the embodiment are equivalent to previous embodiments, and then same figure and same label are employed to indicate same object. These main differences are discussed as following. First, metal layer 38 is a copper layer and related metal barrier layer 36 is a copper barrier layer that formed by chemical vapor deposition. Second, the material of over coating layer 40 comprises Ta or TaN. Third, only the slurry of copper is employed. Finally, the depth of over coating layer 40 is direct proportion to the degree of non-uniformity of metal layer 38 (copper layer), and a typical depth is vary from 100 angstroms to about 1000 angstroms.

It will be understood that various modifications may be made to these embodiments disclosed herein. Therefore, the above description should not be construed as limiting, but merely as exemplifications of preferred embodiments. Those skilled in the art will envision other modifications with the scope and spirit of these claims appended hereto.

What is claimed is:

1. A method for improving non-uniformity of chemical mechanical polishing by over coating layer, said method comprising:

forming an over coating layer on a surface of a semiconductor wafer; and planarizing said surface of said semiconductor wafer by a chemical mechanical polishing process with a slurry, wherein polishing rate of said over coating layer is less than polishing rate of underlying said surface of semiconductor wafer.

2. The method according claim 1, wherein said surface of said semiconductor wafer comprises a plurality of semiconductor structures, and a coating layer is formed over said surface of said semiconductor wafer and covers said semiconductor structures.

3. The method according to claim 2, wherein said semiconductor structures comprises gate, electrode of capacitor, isolation layer and metal plug.

4. The method according to claim 2, wherein material of said coating layer comprises metal and dielectric.

5. The method according to claim 1, wherein said chemical mechanical polishing process is modulated to let polishing rate of said over coating layer is higher than polishing rate of said coating layer.

6. The method according to claim 1, wherein method of forming said over coating layer comprises chemical vapor deposition method and physical vapor deposition method.

7. The method according to claim 1, wherein slurry of said chemical mechanical polishing process comprises slurry of said coating layer and slurry of said over coating layer.

8. The method according to claim 1, wherein depth of said over coating layer is direct proportional to non-uniformity of said coating layer, and a typical depth range is about 100 angstroms to 1500 angstroms.

9. A method for improving non-uniformity of metal damascene method by over coating layer, said method comprising:

forming a metal structure on a surface of a wafer, wherein a plurality of trenches located in said metal structure;

forming a metal barrier layer on a surface of said metal structure;

forming a metal layer over said metal barrier layer, wherein said metal barrier layer filling said trenches;

forming an over coating layer on said metal layer, wherein polishing rate of said over coating layer is lower than polishing rate of a underlying layer; and planarizing said surface of said metal layer by a chemical mechanical polishing process with a slurry.

10. The method according to claim 9, wherein said surface of said wafer comprises a prior metal line or a plurality of semiconductor structures.

11. The method according to claim 10, wherein said other semiconductor structures comprises gate and interconnect.

12. The method according to claim 9, wherein material of said over coating layer comprises material of said metal barrier layer.

13. The method according to claim 9, wherein said material of said metal barrier layer comprises Ta, Ti, TaN and TiN.

14. The method according to claim 9, wherein method of said forming an over coating layer comprises chemical vapor deposition method and physical vapor deposition method.

15. The method according to claim 9, wherein depth of said over coating layer is dependent on non-uniformity of said metal layer, and a typical depth is about 100 angstroms to 1500 angstroms.

16. The method according to claim 9, wherein slurry of said chemical mechanical polishing process comprises slurry of said metal layer and slurry of said over coating layer.

17. A method for enhancing uniformity of copper chemical mechanical polishing by over coating layer, said method comprising:

forming a semiconductor structure on a surface of a wafer, said semiconductor substrate comprises a trench;

forming a copper barrier layer over a surface of said semiconductor structure;

forming a copper layer on said copper barrier layer;

forming an over coating layer over said copper layer, wherein said over coating layer having a polishing rate lower than a polishing rate of underlying said copper layer; and planarizing a surface of said copper layer by a chemical mechanical polishing process with the slurry of copper.

18. The method according to claim 17, wherein said semiconductor structure is employed to define location and shape of said trench.

19. The method according to claim 17, wherein material of said over coating layer comprises Ta and TaN.

20. The method according to claim 17, wherein depth of said over coating layer is strongly depends on degree of non-uniformity of said copper layer, and a typical depth is vary from 100 angstroms to 1000 angstroms.

* * * * *